United States Patent
Papageorgiou et al.

(10) Patent No.: US 7,616,021 B2
(45) Date of Patent: Nov. 10, 2009

(54) METHOD AND DEVICE FOR DETERMINING AN OPERATIONAL LIFETIME OF AN INTEGRATED CIRCUIT DEVICE

(75) Inventors: Vassilios Papageorgiou, Austin, TX (US); Amado Ramirez, Austin, TX (US); Michael Zhouying Su, Round Rock, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 11/624,258

(22) Filed: Jan. 18, 2007

(65) Prior Publication Data

US 2008/0174329 A1 Jul. 24, 2008

(51) Int. Cl.
*G01R 31/26* (2006.01)
(52) U.S. Cl. .................................................... 324/765
(58) Field of Classification Search ................. 324/765
See application file for complete search history.

(56) References Cited

U.S. PATENT DOCUMENTS

| | | | | |
|---|---|---|---|---|
| 5,600,578 A | * | 2/1997 | Fang et al. ..................... 703/14 |
| 6,806,720 B2 | * | 10/2004 | Vollersten ..................... 324/551 |
| 7,183,799 B1 | * | 2/2007 | Donlin et al. .................. 326/38 |
| 7,220,990 B2 | * | 5/2007 | Aghababazadeh et al. .... 257/48 |
| 2005/0062733 A1 | * | 3/2005 | Morita ........................ 345/204 |
| 2006/0044047 A1 | * | 3/2006 | Porter .......................... 327/512 |
| 2006/0054994 A1 | * | 3/2006 | Harris et al. ................. 257/532 |
| 2006/0158210 A1 | * | 7/2006 | Tsai et al. .................... 324/765 |
| 2006/0173444 A1 | * | 8/2006 | Choy et al. ............... 604/891.1 |
| 2006/0176049 A1 | * | 8/2006 | Anderson et al. ........ 324/158.1 |
| 2007/0132523 A1 | * | 6/2007 | Newman .................... 331/175 |

* cited by examiner

*Primary Examiner*—Ha Tran T Nguyen
*Assistant Examiner*—Shaun Campbell

(57) ABSTRACT

An integrated circuit device includes a degradable test structure, a first external interface pin and a second external interface pin, a first conductive path coupling a first node of the degradable test structure and the first external interface pin, and a second conductive path coupling a second node of the degradable test structure and the second external interface pin. Another integrated circuit device includes a non-volatile memory device, a counter comprising an input configured to receive a first clock signal and an output to provide a count value, and control logic configured to store the count value of the counter in the non-volatile memory, whereby the non-volatile memory is externally accessible.

3 Claims, 5 Drawing Sheets

US 7,616,021 B2

METHOD AND DEVICE FOR DETERMINING AN OPERATIONAL LIFETIME OF AN INTEGRATED CIRCUIT DEVICE

FIELD OF THE DISCLOSURE

The present disclosure relates generally to integrated circuit devices and more particularly to determining operational lifetimes of integrated circuit devices.

BACKGROUND

The point at which an integrated circuit device fails typically is a result of the cumulative duration of its operation. However, conventional integrated circuit devices do not provide a reliable means for accurately measuring their operational lifetimes, or ages, on the basis of cumulative operation time. Thus, statistics related to the operational lifetimes of a class or type of integrated circuit device can be difficult to obtain. A technique for determining the operational lifetime of an integrated circuit device therefore would be advantageous.

BRIEF DESCRIPTION OF THE DRAWINGS

The present disclosure may be better understood, and its numerous features and advantages made apparent to those skilled in the art by referencing the accompanying drawings.

The use of the same reference symbols in different drawings indicates similar or identical items.

DETAILED DESCRIPTION

In accordance with one aspect of the present disclosure, a method includes applying a test electrical bias to a degradable test structure of an integrated circuit device via an external interface pin of the integrated circuit device. The method further includes determining a degradable characteristic of the degradable test structure in response to the application of the test electrical bias to the degradable test structure. The method additionally includes determining a representative operational lifetime of the integrated circuit device based on the degradable characteristic.

In accordance with another aspect of the present disclosure, an integrated circuit device includes a degradable test structure, a first external interface pin and a second external interface pin, a first conductive path coupling a first node of the degradable test structure and the first external interface pin, and a second conductive path coupling a second node of the degradable test structure and the second external interface pin.

In accordance with another aspect of the present disclosure, a system includes an integrated circuit device. The integrated circuit device includes a non-volatile memory device, a counter comprising an input configured to receive a clock signal and an output to provide a count value, and control logic configured to store the count value of the counter in the non-volatile memory. The integrated circuit device further includes means for accessing the non-volatile memory external from the integrated circuit device.

Figure 1:
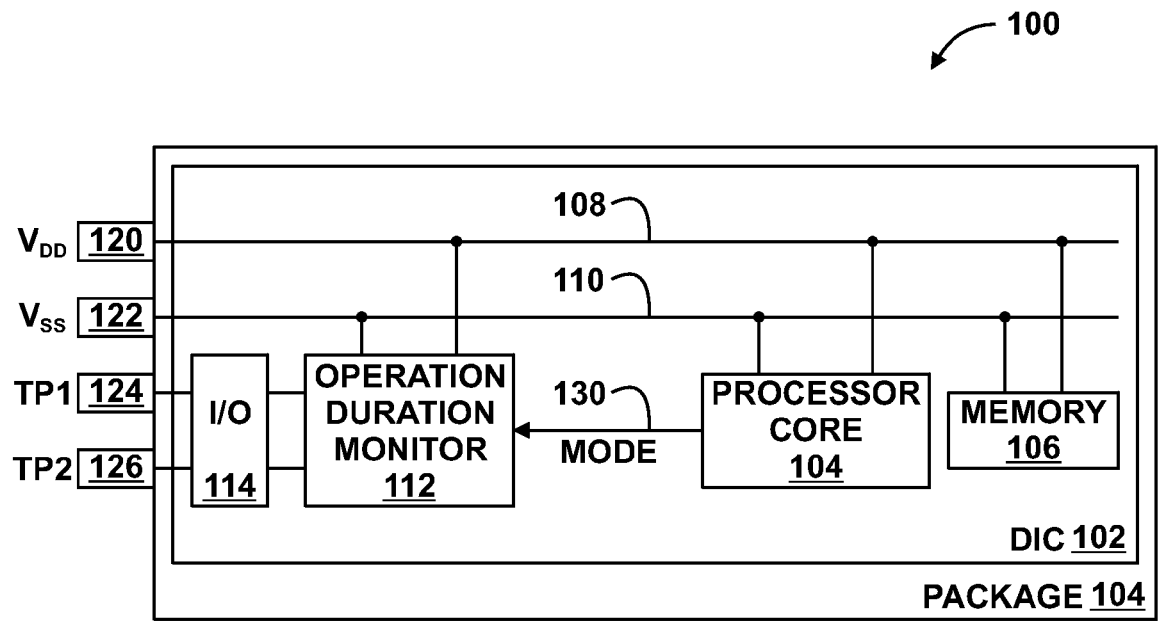
FIG. 1 is a diagram illustrating an integrated circuit device having a monitored operational lifetime in accordance with at least one embodiment of the present disclosure.

FIG. 1 illustrates an example integrated circuit device 100 having operational lifetime estimation capabilities in accordance with at least one embodiment of the present disclosure. In the illustrated example, the integrated circuit device 100 includes a die 102 assembled into a package 104. Disposed at the die 102 are a plurality of circuit components, such as, for example, a processor core 104 and a memory 106, and a plurality of power busses, such as a Vdd bus 108 and a Vss bus 110, to which the circuit components are connected. Also disposed at the die 102 and connected to the Vdd bus 108 and the Vss bus 110 is an operational duration monitor 112 and a test input/output (I/O) 114.

The package 104 includes external interface pins (e.g., package pins, bumps, posts, balls, etc.), including a Vdd power pin 120, a Vss power pin 122, a test probe (TP1) pin 124 and a test probe (TP2) pin 126. The Vdd power pin 120 is connected to the Vdd bus 110, the Vss power pin 122 is connected to the Vss bus 110, and the TP1 pin 124 and the TP2 pin 126 are connected to the operation duration monitor 112 via the test I/O 114. The test I/O 114 can include, for example, I/O cells with input and output drivers, electrostatic discharge protection circuits, and the like.

In one embodiment, while the integrated circuit device 100 is activated, or "powered on," a stimulus is provided to the operation duration monitor 112, whereby a characteristic of the operation duration monitor 112 changes over time in response to the provided stimulus. At one or more points in time, the current state of the characteristic of the operation duration monitor 112 can be determined via the test probe pins 124 and 126 and an estimated operational lifetime of the integrated circuit device 100 can be determined based on the current state of the characteristic. The estimated operational lifetime can be used, for example, to determine a warranty status of the integrated circuit device 100, to compile durability characteristics for the integrated circuit device 100 and other integrated circuit devices of like types, and so forth.

Figure 3:
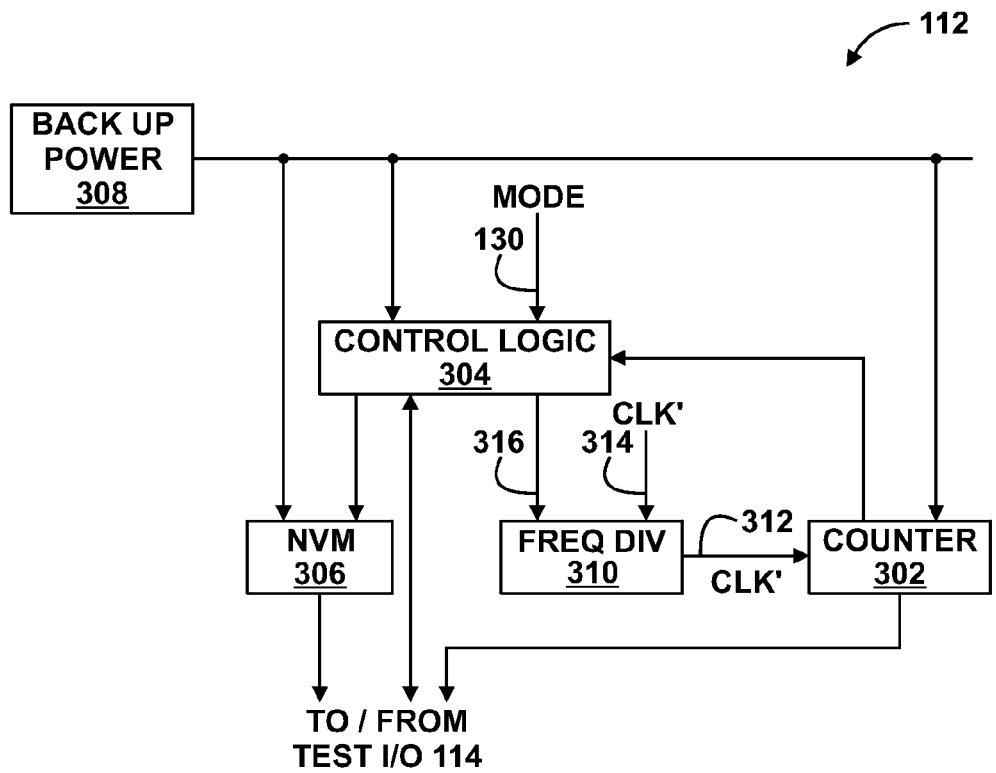
FIG. 3 is a diagram illustrating a counter-based implementation of an operational duration monitor of an integrated circuit device in accordance with at least one embodiment of the present disclosure.
Figure 4:
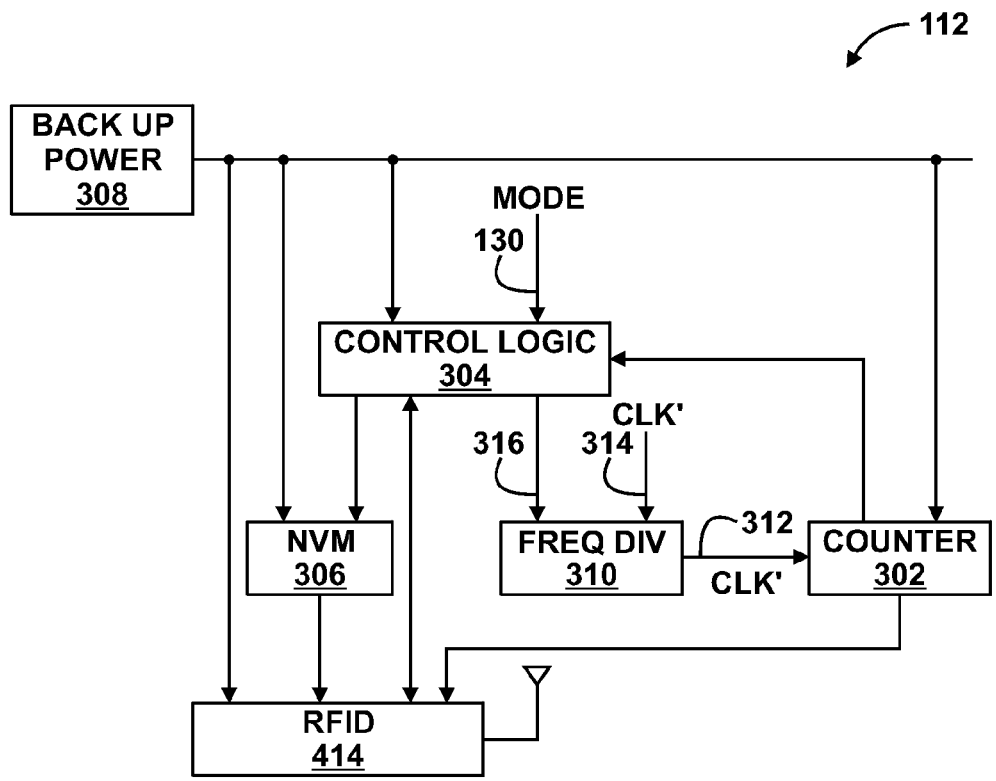
FIG. 4 is a diagram illustrating another counter-based implementation of an operational duration monitor of an integrated circuit device in accordance with at least one embodiment of the present disclosure.

As described herein in greater detail with reference to FIGS. 3 and 4, the operation duration monitor 112 can be based on a counter that increments in response to a clock signal or other substantially periodic signal. In this instance, the application of power and the application of the clock signal to the counter can serve as stimuli and, accordingly, the change in the count value of the counter can serve as the characteristic that changes over time in response to the stimulus. Accordingly, a test probe can be connected to the test probe pins 124 and 126 to obtain the current count value from the operation duration monitor 112. Because the counter can be activated whenever the integrated circuit device 100 is operated, the current count value is representative of the operational lifetime of the integrated circuit device 100. Accordingly, the current count value can be used to determine a representative, or estimated, operational lifetime of the integrated circuit device 100. To illustrate, assume that the integrated circuit device 100 is operating using a clock having a frequency of 1 gigahertz (GHz) and the counter increments every billion cycles of the clock. In this example, the counter would increment its count value for every second that the integrated circuit device 100 is operated, and thus the current count value can be used to determine the cumulative number of seconds that the integrated circuit device 100 has been operated.

Figure 5:
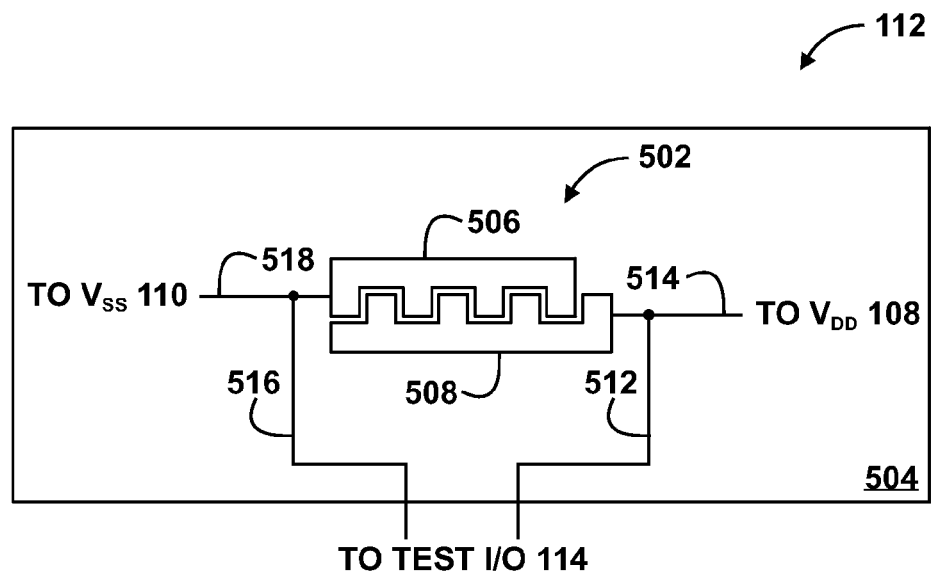
FIG. 5 is a diagram illustrating a degradable test structure-based implementation of an operational duration monitor of an integrated circuit device in accordance with at least one embodiment of the present disclosure.
Figure 6:
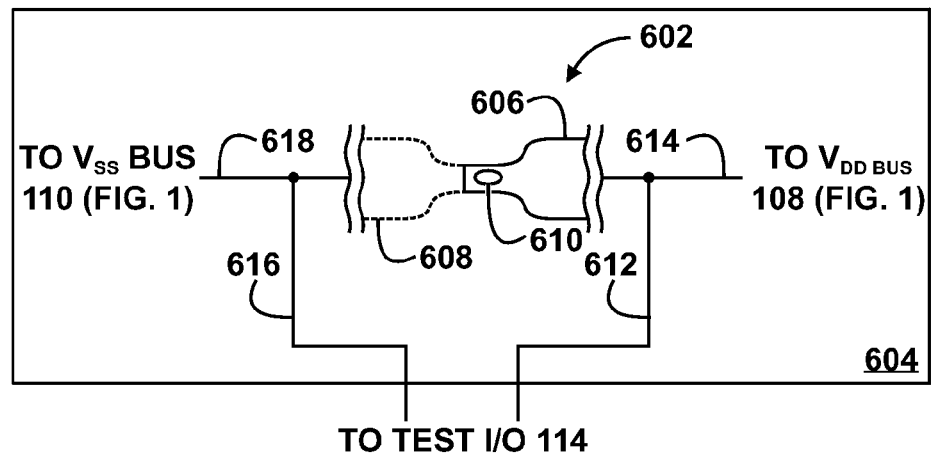
FIG. 6 is a diagram illustrating a plan view of a degradable test structure-based implementation of an operational duration monitor of an integrated circuit device in accordance with at least one embodiment of the present disclosure.
Figure 7:
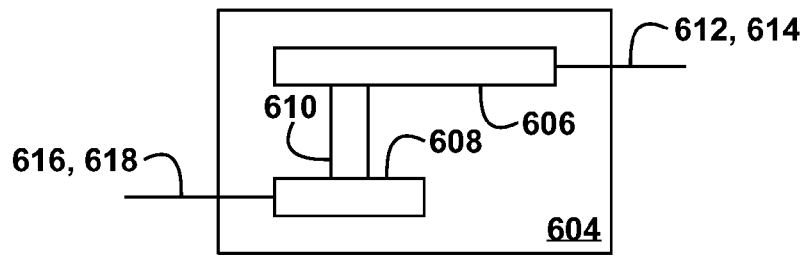
FIG. 7 is a diagram illustrating a cross-section view of the degradable test structure-based implementation of FIG. 6 in accordance with at least one embodiment of the present disclosure.

As described in greater detail herein with reference to FIGS. 5, 6, and 7, the operation duration monitor 112 alternately can be based on a degradable test structure. The term "degradable test structure," as used herein, refers to a structure characterized as having a resistance characteristic or a leakage current characteristic that changes over time in response to application of an electrical bias. The electrical bias can include a bias voltage or a bias current. In one embodiment, the degradable test structure includes a metal structure that is implemented at a die of the integrated circuit device and which exhibits metal migration or dissipation cumulating from the application of an electrical bias. Examples of a degradable test structure can include, for example, metal comb structures and via devices. It will be appreciated that the application of a electrical bias to a metal comb structure typically results in dielectric breakdown while stressed over time, thereby increasing the leakage current exhibited by the metal comb structure in response to a determined electrical bias. Further, it will be appreciated that the application of an electrical bias to a via structure typically results in metal migration at the grain boundaries of the via, thereby resulting in an increase in the resistance of the via structure in response to a determined electrical bias.

Thus, for degradable test structure-based implementations, the stimulus is the application of the electrical bias to the degradable test structure and the characteristic that changes over time includes one or both of a change in resistance or a change in leakage current of the degradable test structure. Thus, in one embodiment, a test probe can be connected to the test probe pins 124 and 126 and a test bias can be applied to the degradable test structure via the test probe, whereby the test probe can determine the current state of in the resistance characteristic or the leakage current characteristic of the degradable test structure in response to the application of the electrical bias. To illustrate, the test probe can bias the degradable test structure by applying a predetermined voltage to the degradable test structure to detect the current flowing through the degradable test structure in response to the application of the predetermined voltage. With knowledge of the predetermined voltage and the resulting current, the resistance of the degradable test structure can be determined using the relationship $V=I*R$, where V represents the predetermined voltage, I represents the resulting current, and R represents the resistance of the degradable test structure at the time of the test. Similarly, a predetermined current can be applied and the voltage across the degradable test structure and the predetermined current can be used to determine the resistance of the degradable test structure. In a similar manner, a predetermined voltage or predetermined current can be applied to determine the leakage current exhibited by the degradable test structure at the time of the test.

The determined resistance characteristic or the determined leakage current characteristic of the degradable test structure can be compared with an age model to determine an estimated operational lifetime of the integrated circuit device 100. To illustrate, an age model can be determined based on testing of integrated circuit devices of the same type as the integrated circuit device 100, whereby the age model can be represented by, for example, table correlating resistances to corresponding operational lifetimes. Thus, because the cumulative application of the electrical bias to the degradable test structure during activation of the integrated circuit device 100 has, in this example, the effect of changing the resistance characteristic of the degradable test structure, a determined resistance characteristic of the degradable test structure can be compared to the table to identify the corresponding representative operational lifetime of the integrated circuit device 100.

In one embodiment, the operation duration monitor 112 is configured so that the same stimulus is applied during activation of the integrated circuit device 100 regardless of the mode of operation of the integrated circuit device 100. However, it will be appreciated that the integrated circuit device 100 can be taxed more in certain modes of operation compared to other modes of operation, and therefore it may be advantageous for the representative operational lifetime of the integrated circuit device 100 to more accurately reflect how the integrated circuit device 100 was used. To illustrate, certain integrated circuit devices can implement a low power or "sleep" mode during which the integrated circuit devices are minimally functional. It therefore will be appreciated that an integrated circuit device that operates more frequently in a low power mode typically will exhibit less device degradation than another integrated circuit device that operates less frequently in the low power mode for the same operational lifetime. Accordingly, in an alternate embodiment, the processor core 104 or another circuit component is configured to provide a mode signal 130 representative of the current operational mode of the integrated circuit device 100 to the operation duration monitor 112. The operation duration monitor 112, in turn, is configured to adjust the rate of change of its representational characteristic (e.g., count value, resistance characteristic, or leakage current characteristic) based on the mode of operation of the integrated circuit device 100 indicated by the mode signal 130. To illustrate, when the mode signal 130 indicates that the integrated circuit device 100 is in a low power mode, the operation duration monitor 112 can reduce the rate at which its counter increments while in the low power mode for counter-based implementations. For degradable test structure-based implementations, the operation monitor 112 can reduce the magnitude of the electrical bias applied to its degradable test structure when the integrated circuit device 100 is in a low power mode, thereby reducing the rate of change in the resistance characteristic or the leakage current characteristic of the degradable test structure.

Figure 2:
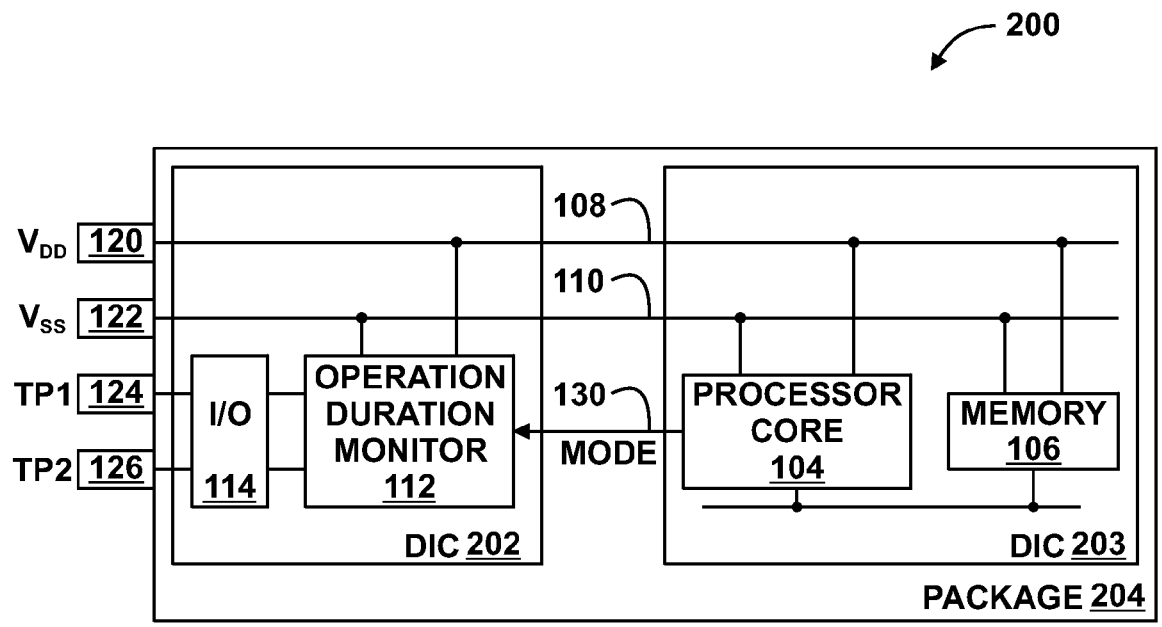
FIG. 2 is a diagram illustrating another integrated circuit device having a monitored operational lifetime in accordance with at least one embodiment of the present disclosure.

FIG. 2 illustrates an alternate implementation of an integrated circuit device 200 having the operation duration monitor 112 in accordance with at least one embodiment of the present disclosure. In the illustrated example, the integrated circuit device 200 includes separate dies (die 202 and die 203) assembled into a package 204. Disposed at the die 203 are a plurality of circuit components, such as, for example, the processor core 104 and the memory 106. Disposed at the die 202 are the operation duration monitor 112 and the test I/O 114. The package 204 includes external interface pins (e.g., package pins, bumps, balls, etc.), including the Vdd power pin 120, the Vss power pin 122, the test probe (TP1) pin 124 and the test probe (TP2) pin 126. As with the implementation of FIG. 1, the Vdd power pin 120 can be connected to the Vdd bus 108, the Vss power pin 122 can be connected to the Vss bus 110, and the test probe pins 124 and 126 are connected to the operation duration monitor 112 via the test I/O 114.

Thus, in contrast to implementing the operation duration monitor 112 on a single die with the other circuit components of an integrated circuit device as illustrated in FIG. 1, the integrated circuit device 200 instead implements the operation duration monitor 112 on a separate die. The implementation of the operation duration monitor 112 on a separate die can have a number of advantages. To illustrate, the components of the operation duration monitor 112 can be fabricated at the die 202 using different design constraints than the ones used for the fabrication of the components of the die 203, thereby facilitating the use of more reliable or less expensive fabrication techniques for the operation duration monitor 112.

FIG. 3 illustrates a counter-based implementation of the operation duration monitor 112 in accordance with at least one embodiment of the present disclosure. In the illustrated example, the operation duration monitor 112 includes a counter 302, control logic 304, a non-volatile memory 306, a back-up power source 308, and a frequency divider 310. The counter 302 includes an input to receive a clock signal (CLK) 312 and an output to provide a count value based on the clock signal 312. The non-volatile memory 306 includes any of a variety of memory structures capable of maintaining a state representative of the count value even in the event of a failure of the integrated circuit device in which the operation duration monitor 112 is implemented. To illustrate, the non-volatile memory 306 can include flash memory to store the count value. As another example, the non-volatile memory 306 can include a fuse array comprising a plurality of fuses, whereby the number of blown fuses of the fuse array can represent the count value.

The control logic 304, in one embodiment, is configured to store the count value of the counter 302 at the non-volatile memory 306. The control logic 304 can store the count value every time the count value is adjusted, on a periodic basis, and the like. The control logic 304 also is configured to interface with a test probe via the test I/O 114 so as to facilitate the output of the stored counter value for the test probe via the test I/O 114.

The back-up power source 308 is configured to provide temporary power to the other components of the operation duration monitor 112 in the event of a failure of the integrated circuit device so that the non-volatile memory 306 can be accessed to determine the current count value at the time of failure of the integrated circuit device. The back-up power source 308 can include, for example, a battery, a storage capacitor, and the like.

In operation, the clock signal 312 is provided to the counter 302, which adjusts its count value based on the cycles of the clock signal 312. In one embodiment, the counter 302 is initialized to a low count value (e.g., zero) and incremented based on the clock signal 312. In another embodiment, the counter 302 is initialized to a high count value and decremented based on the clock signal 312. The rate at which the count value is adjusted can be configured based on the expected maximum operational lifetime of the integrated circuit device, the frequency of the clock signal 312, and the like. To illustrate, the clock signal 312 may be based on a system clock signal for a processor and therefore may have a frequency measured in gigahertz. Thus, in most implementations, it would be impracticable to increment the counter 302 at every cycle of the system clock signal as the count value would be in the trillions within hours. Accordingly, the counter 302 can be configured to adjust for every Nth cycle of the clock signal 312, whereby the number N of cycles before the count value is adjusted can be determined based on the clock frequency, the maximum count value supported by the counter 302, and the expected operational lifetime of the integrated circuit device. Alternately, a frequency divider 310 can be utilized to divide a source clock signal 314 by a predetermined divisor to generate the clock signal 312 with a more suitable frequency. In another embodiment, the operation duration monitor 112 includes a clock source (not shown) with a suitable frequency.

As discussed above, the operation duration monitor 112 can alter the rate at which the count value is adjusted during the operation of the integrated circuit device based on the mode of operation of the integrated circuit device. Accordingly, in one embodiment, the control logic 304 receives the mode signal 130 indicating the mode of operation and adjusts the adjustment rate of the counter 302. To illustrate, the control logic 304 can provide a control signal 316 to the frequency divider 310 to adjust the divisor based on the mode of operation. The control logic 304 can configure the frequency divider 310 to implement a larger divisor when the integrated circuit device is in a low power mode, thereby decreasing the rate of adjustment of the counter 302 due to the reduced frequency of the resulting clock signal 312. Conversely, the control logic 304 can configure the frequency divider 310 to implement a smaller divisor when the integrated circuit device is in a high power mode, thereby increasing the rate of adjustment of the counter 302 due to the increased frequency of the resulting clock signal 312.

FIG. 4 illustrates another counter-based implementation of the operation duration monitor 112 in accordance with at least one embodiment of the present disclosure. As with the embodiment of FIG. 3, in the illustrated example of FIG. 4, the operation duration monitor 112 includes the counter 302, the control logic 304, the non-volatile memory 306, the backup power source 308, and the frequency divider 310. Further, rather than utilizing the test I/O 114 (FIG. 2) to facilitate communication of the count value to a test probe, in the depicted implementation, the operation duration monitor 112 includes a wireless interface, such as a radio frequency identification (RFID) interface 414 (e.g., an inductively coupled RFID tag), configured to access the count value from the non-volatile memory 306 and wirelessly transmit the accessed count value to a RFID reader. Thus, because the RFID interface 414 does not require direct physical contact by an RFID reader, the current count value of the operation duration monitor 112 can be accessed by the RFID reader without requiring the removal of the integrated circuit device from the system in which it is implemented.

FIG. 5 illustrates an implementation of the operation duration monitor 112 using a metal comb structure in accordance with at least one embodiment of the present disclosure. In the depicted example, the operation duration monitor 112 is configured as a degradable test structure implemented as a metal comb structure 502 disposed at a die 504, whereby the die 504 can include, for example, the die 102 (FIG. 1) or the die 202 (FIG. 2). The metal comb structure 502 can be incorporated into or interconnected with the die 504. The metal comb structure 502 includes finger structure 506 and finger structure 508 composed of a conductive material (e.g., copper), whereby the finger protrusions of the finger structure 506 are interleaved with the finger protrusions of the finger structure 508. The finger structure 508 is connected to the test pin 124 (FIG. 1) via a conductive path 512 and electrically connected to a voltage reference (e.g., the Vdd bus 108, FIG. 1) via a conductive path 514. The finger structure 508 is connected to the test pin 126 (FIG. 1) via a conductive path 516 and connected to another voltage reference (e.g., the Vss bus 110, FIG. 1) via a conductive path 518. The metal comb structure 502 can be fabricated at a single layer of the die 504 or it can be fabricated over multiple layers of the die 504. Initially, the metal comb structure 502 is fabricated such that the finger structures 506 and 508 are substantially electrically isolated from each other.

During operation of the integrated circuit device in which the metal comb structure 502 is implemented, the metal comb structure 502 is subjected to an electrical bias based on, for example, the voltage difference between the Vdd bus 108 and the Vss bus 110. Due to the physical properties of the conductive material of the finger structures 506 and 508 and the semiconductor material of the die 504, the finger structures 506 and 508 exhibit dielectric breakdown over time, and thus increasing the leakage current exhibited by the metal comb structure 502 over time. Accordingly, it will be appreciated that the leakage current exhibited by the metal comb structure 502 is representative of the operational lifetime of the integrated circuit device.

In order to determine the leakage current characteristic of the metal comb structure 502, and thus an estimate of the operational lifetime of the integrated circuit device, a test probe is connected to the test probe pins 124 and 126 (FIGS. 1 and 2) and the test probe electrically biases the metal comb structure 502 via the test probe pins 124 and 126. The test probe then can determine the leakage current characteristic of the metal comb structure 502 (or alternately the resistance characteristic of the metal comb structure 502) based on the current transmitted through the metal comb structure 502 in response to the electrical bias generated by the test probe.

FIGS. 6 and 7 illustrate a plan view and a cross-section view, respectively, of an implementation of the operation duration monitor 112 using a via structure in accordance with at least one embodiment of the present disclosure. The operation duration monitor 112 is configured as a degradable test structure implemented as a via structure 602 disposed at a die 604, whereby the die 604 can include, for example, the die 102 (FIG. 1) or the die 202 (FIG. 2). The via structure 602 can be incorporated into or interconnected with the die 604. The via structure 602 includes a conductive structure 606 (e.g., a conductive trace) at a first layer of the die 604, a conductive structure 608 at a second layer of the die 604, and a via 610 connecting the conductive structures 606 and 608. The conductive structure 606 is connected to the test probe pin 124 (FIGS. 1 and 2) via a conductive path 612 and connected to a voltage reference (e.g., the Vdd bus 108, FIGS. 1 and 2) via a conductive path 614. The conductive structure 608 is connected to the test probe pin 126 (FIGS. 1 and 2) by a conductive path 616 and connected to a voltage reference (e.g., the Vss bus 110, FIGS. 1 and 2) by a conductive path 618.

During operation of the integrated circuit device in which the via structure 602 is implemented, the via structure 602 is subjected to an electrical bias based on, for example, the voltage difference between the Vdd bus 108 and the Vss bus 110. Due to the physical properties of the conductive material of the via 610 and the conductive structures 606 and 608, the via structure 602 exhibits metal migration in response to the electrical bias, thereby increasing the effective resistance of the via structure 602. Accordingly, it will be appreciated that the resistance exhibited by the via structure 602 is representative of the operational lifetime of the integrated circuit device.

In one implementation, one or both of the conductive structures 606 and 608 are fabricated such that they narrow in width, depth, or both, near the via 610 so as to increase the electron density at the via 610. This focuses the metal migration at the via 610 such that a large proportion of the metal migration occurs at the grain boundaries of the via 610, which can provide a more controlled change in resistance of the via structure 602.

In order to determine the resistance characteristic of the via structure 602, and thus an estimate of the operational lifetime of the integrated circuit device, a test probe is connected to the test probe pins 124 and 126 (FIGS. 1 and 2) and the test probe electrically biases the via structure 602 via the test probe pins 124 and 126. The test probe then can determine the resistance characteristic of the via structure 602 based on the measure current (when the electrical bias is a predetermined voltage) or based on the measured voltage (when the electrical bias is a predetermined current) exhibited by the via structure 602 in response to the electrical bias generated by the test probe.

Figure 8:
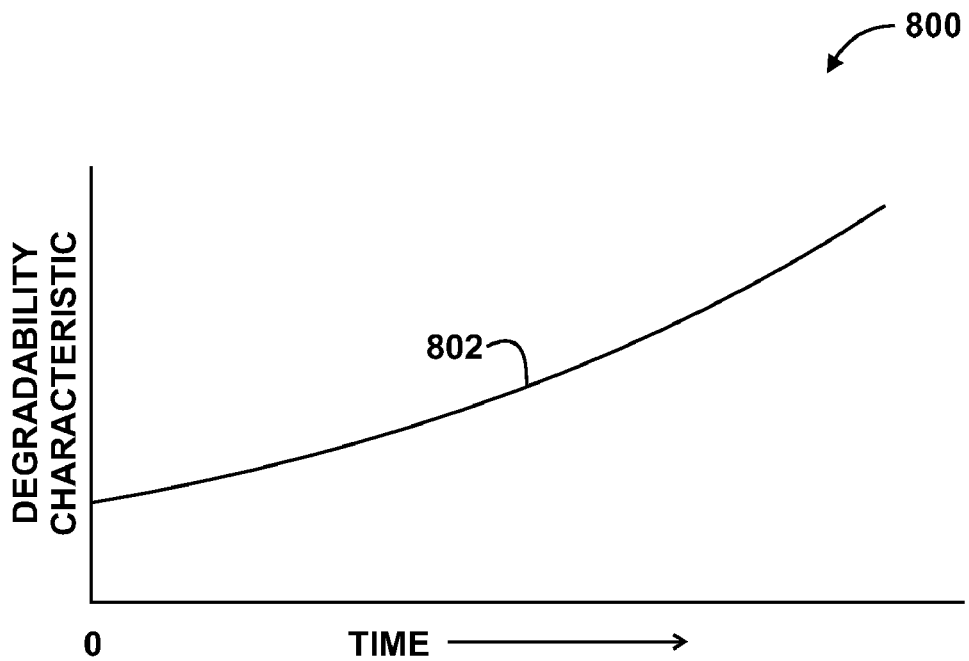
FIG. 8 is a chart illustrating a change in a degradation characteristic of a degradable test structure of an integrated circuit device over time in accordance with at least one embodiment of the present disclosure.

FIG. 8 illustrates an example chart 800 illustrating a relationship between a degradable characteristic of a degradable test structure and the operational lifetime of the degradable test structure in accordance with at least one embodiment of the present disclosure. In the depicted example, the ordinate axis (or y-axis) of the chart 800 represents the degradable characteristic of the degradable test structure. The degradable characteristic can include, for example, a resistance characteristic or a leakage current characteristic. The abscissa axis (or x-axis) of the chart 800 represents the operational lifetime of the integrated circuit device. Line 802 illustrates an example relationship between the operational lifetime and the magnitude of the degradable characteristic. This relationship can be determined based on theoretical modeling, statistical testing, or a combination thereof. Further, this relationship can be determined for a class of integrated circuit devices, on a particular model, and the like.

After the relationship represented by line 802 has been established, the information represented by line 802 can be implemented in a table, an approximate equation, and the like, and a test probe can use the information to determine the representative operational lifetime of an integrated circuit device under test based on its particular measured degradable characteristic at the time of testing.

Figure 9:
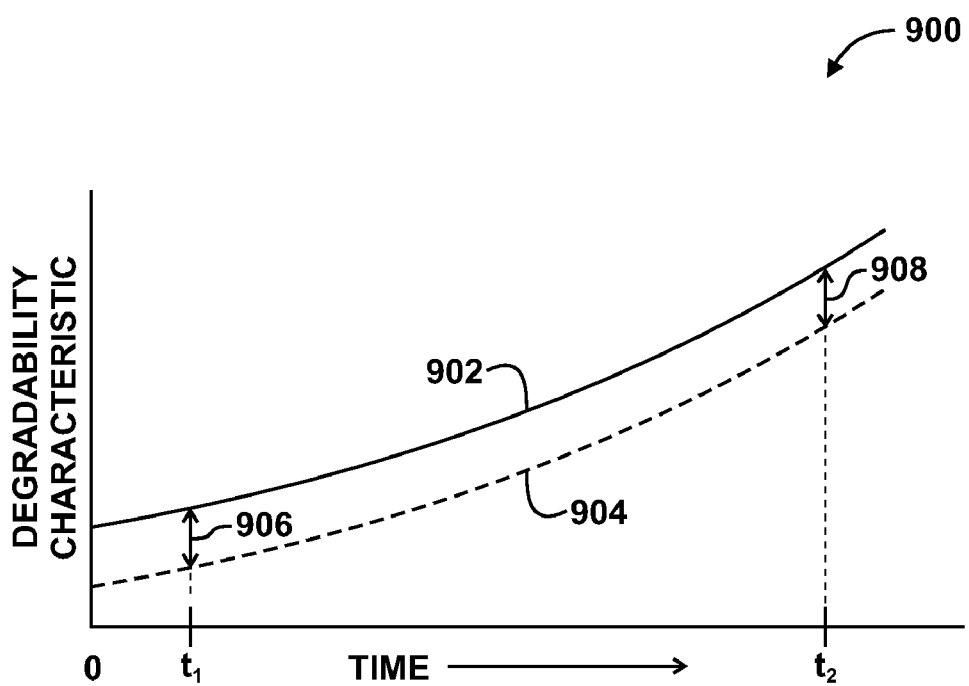
FIG. 9 is a chart illustrating the use of an offset to adjust a change in a degradation characteristic of a degradable test structure based on a predetermined model in accordance with at least one embodiment of the present disclosure.

FIG. 9 illustrates a chart representative of an adjustment to an integrated circuit device in accordance with at least one embodiment of the present disclosure. As with the chart 800 of FIG. 8, the ordinate axis (or y-axis) of the chart 900 represents the degradable characteristic of the degradable test structure and the abscissa axis (or x-axis) of the chart 900 represents the operational lifetime of the integrated circuit device. The line 902 illustrates a modeled relationship between the operational lifetime and the magnitude of the degradable characteristic for integrated circuit devices of the same type. The modeled relationship can be based on an average of a number of tested integrated circuit devices, based on theoretical modeling, or a combination thereof. The line 904 illustrates a relationship between the operational lifetime and the magnitude of the degradable characteristic for a particular integrated circuit device.

In at least one embodiment, the test probe is configured to determine the operational lifetime of an integrated circuit device based on the modeled relationship represented by line 902. Accordingly, if the actual relationship of a particular integrated circuit device represented by line 904 significantly deviates from the modeled relationship, substantial error could be introduced into the estimation of the representative operational lifetime of the particular integrated circuit device. Accordingly, in at least one embodiment, an adjustment can be made to the degradable test structure of the integrated circuit device so as to more closely align the actual relationship (line 904) to the modeled relationship (line 902). The adjustment can be made after initial fabrication of the integrated circuit device (e.g., adjustment 906 at time $t_1$) or the adjustment can be made after the integrated circuit device has been operating for a period of time (e.g., adjustment 908 at time $t_2$).

Figure 10:
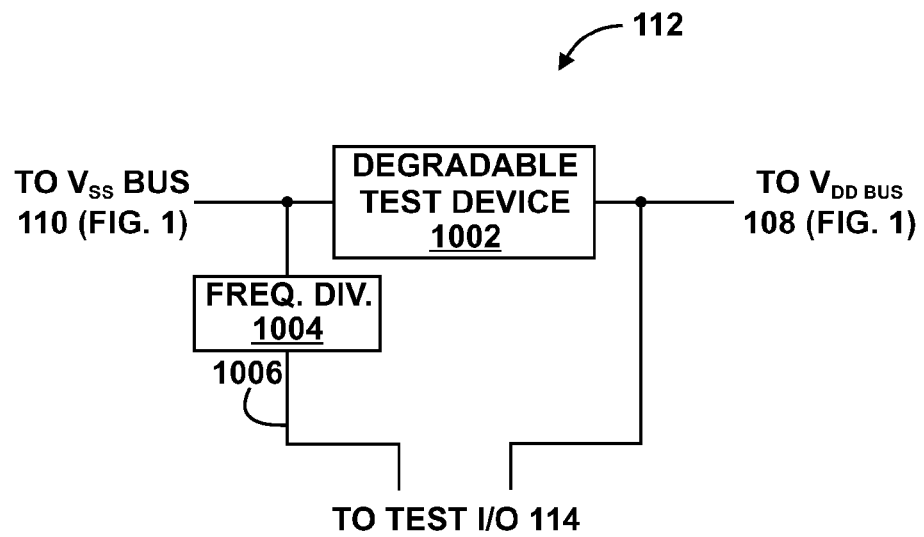
FIG. 10 is a diagram illustrating a degradable test structure-based operational duration monitor having a fuse bank to implement an offset adjustment in accordance with at least one embodiment of the present disclosure.

FIG. 10 illustrates an adjustable implementation of the operation duration monitor 112 (FIG. 1) in accordance with at least one embodiment of the present disclosure. In the illustrated example, the operation duration monitor 112 includes a degradable test structure 1002 connected to the Vdd bus 108 (FIG. 1) and the Vss bus 110 (FIG. 1) and to the test I/O 114 (FIG. 1). The operation duration monitor 112 further includes an adjustment module 1004 that has an adjustable resistance so as to adjust the cumulative resistance exhibited by the operation duration monitor 112 when electrically biased by a test probe. To illustrate, the adjustment module 1004 can include a fuse bank disposed in series on a conductive path 1006 between one node of the degradable test structure and one of the test probe pins 124 or 126 (FIG. 1). Accordingly, to implement one of the adjustments 906 and 908 (FIG. 8) so as to more closely align the degradable characteristic of the degradable test structure 1002 with the modeled degradable characteristic, one or more of the fuses can be blown so as to increase the overall resistance of the fuse bank and thus the overall resistance observed between the test probe pins 124 and 126. In another embodiment, the adjustment module 1004 can include a trimmable resistor that can be trimmed to achieve a desired resistance for the purpose of aligning the integrated circuit device with a model or average integrated circuit device.

Figure 11:
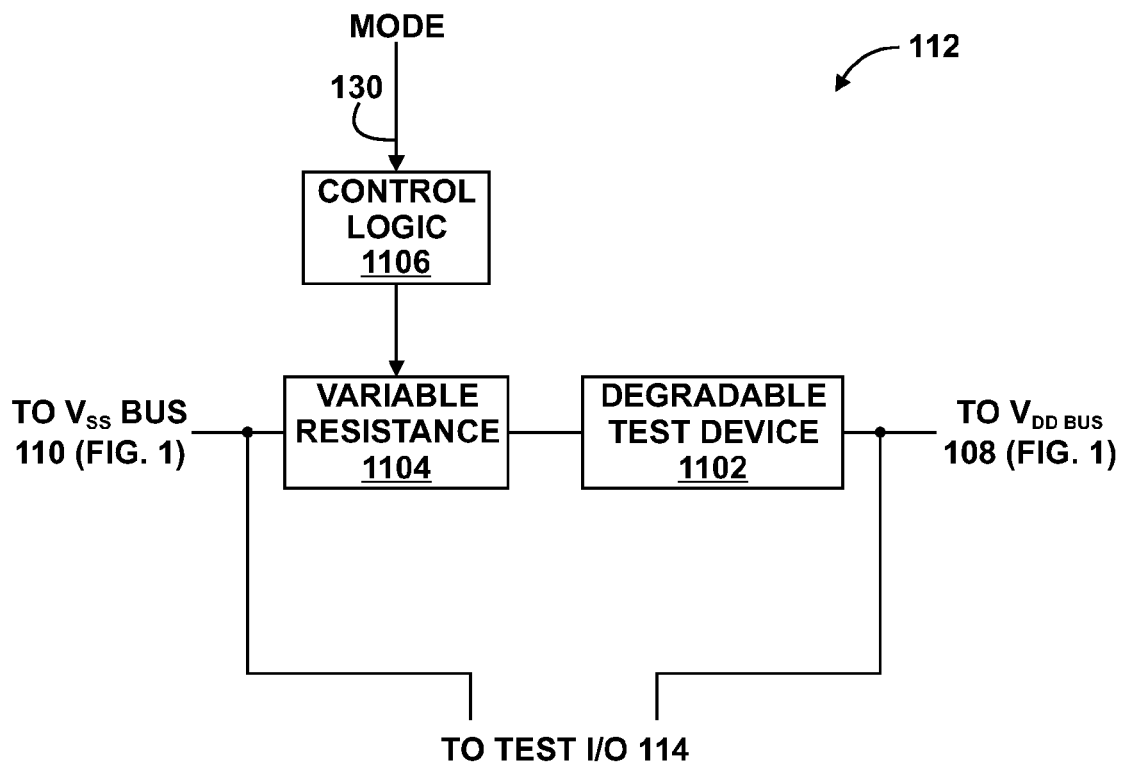
FIG. 11 is a diagram illustrating a degradable test structure-based operational duration monitor that is adjustable based on a mode of operation of an integrated circuit device in accordance with at least one embodiment of the present disclosure.

FIG. 11 illustrates another degradable test structure-based implementation of the operation duration monitor 112 in accordance with at least one embodiment of the present disclosure. In the depicted example, the operation duration monitor 112 includes a degradable test structure 1102 (e.g., a metal comb structure, a via structure, a trace structure, etc.), a variable resistance device 1104, and control logic 1106. The degradable test structure 1102 and the variable resistance device 1104 are connected in series between the Vdd bus 108 (FIG. 1) and the Vss bus 110 (FIG. 1). The variable resistance device 1104 can include, for example, a variable resistor (e.g., a varactor), a set of different resistors selectable via a multiplexer, and the like.

As noted above, an integrated circuit device can provide a mode signal 130 (FIG. 1) indicating the current mode of operation of the integrated circuit device. As some modes of operation may be more stressful to the integrated circuit device than others, it may be appropriate to adjust the electrical bias applied to the degradable test structure 1102 depending on the mode of operation. Accordingly, in one embodiment, the control logic 1106 receives the mode signal 130 and, based on the mode of operation indicated by the mode signal 130, adjusts the resistance exhibited by the variable resistance device 1104 so as to adjust the magnitude of the electrical bias applied to the degradable test structure 1102. In instances whereby the mode of operation is a high power mode, the resistance of the variable resistance device 1104 can be lowered, thereby increasing the magnitude of the electrical bias applied to the degradable test structure 110 and thus speeding the rate of change of its degradation characteristic. Conversely, in instances whereby the mode of operation is a low power mode, the resistance of the variable resistance device 1104 can be increased, thereby decreasing the magnitude of the electrical bias applied to the degradable test structure 110 and thus slowing the rate of change of its degradation characteristic.

In this document, relational terms such as "first" and "second", and the like, may be used solely to distinguish one entity or action from another entity or action without necessarily requiring or implying any actual such relationship or order between such entities or actions. The terms "comprises", "comprising", or any other variation thereof, are intended to cover a non-exclusive inclusion, such that a process, method, article, or apparatus that comprises a list of elements does not include only those elements but may include other elements not expressly listed or inherent to such process, method, article, or apparatus. An element preceded by "comprises . . . a" does not, without more constraints, preclude the existence of additional identical elements in the process, method, article, or apparatus that comprises the element.

The term "another", as used herein, is defined as at least a second or more. The terms "including", "having", or any variation thereof, as used herein, are defined as comprising. The term "coupled", as used herein with reference to electrooptical technology, is defined as connected, although not necessarily directly, and not necessarily mechanically.

The terms "assert" or "set" and "negate" (or "deassert" or "clear") are used when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

As used herein, the term "bus" is used to refer to a plurality of signals or conductors which may be used to transfer one or more various types of information, such as data, addresses, control, or status. The conductors as discussed herein may be illustrated or described in reference to being a single conductor, a plurality of conductors, unidirectional conductors, or bidirectional conductors. However, different embodiments may vary the implementation of the conductors. For example, separate unidirectional conductors may be used rather than bidirectional conductors and vice versa. Also, plurality of conductors may be replaced with a single conductor that transfers multiple signals serially or in a time multiplexed manner. Likewise, single conductors carrying multiple signals may be separated out into various different conductors carrying subsets of these signals. Therefore, many options exist for transferring signals.

Other embodiments, uses, and advantages of the disclosure will be apparent to those skilled in the art from consideration of the specification and practice of the disclosure disclosed herein. The specification and drawings should be considered exemplary only, and the scope of the disclosure is accordingly intended to be limited only by the following claims and equivalents thereof.

What is claimed is:

1. A method comprising:
    determining a power mode of an operation of an activated integrated circuit device;
    applying a test electrical bias to a degradable test structure of the integrated circuit device via an external interface pin of the integrated circuit device, wherein a magnitude of the test electrical bias is based on the power mode for the operation of the integrated circuit;
    determining a degradable characteristic of the degradable test structure in response to the application of the test electrical bias to the degradable test structure; and
    determining an estimated cumulative duration for which the integrated circuit device has been in operation based on the degradable characteristic.

2. An integrated circuit device comprising:
    a degradable test structure;
    a resistance structure having an adjustable resistance;
    a first external interface pin and a second external interface pin;
    a first conductive path coupling a first node of the degradable test structure and the first external interface pin via the resistance structure;
    a second conductive path coupling a second node of the degradable test structure and the second external interface pin; and
    control logic configured to adjust the adjustable resistance of the resistance structure based on a power mode of an operation of the integrated circuit device.

3. A system comprising:
    an integrated circuit device comprising:
        a non-volatile memory device;
        a counter comprising an input configured to receive a first clock signal and an output to provide a count value;
        a frequency divider having an input to receive a second clock signal and an output coupled to the input of the counter to provide the first clock signal;
        mode control logic configured to control a frequency division ratio of the frequency divider based on a power mode of an operation of the integrated circuit device;
        control logic configured to store the count value of the counter in the non-volatile memory; and
        means for accessing the count value from the non-volatile memory external from the integrated circuit device.

* * * * *